United States Patent
Bartik et al.

(10) Patent No.: US 10,262,702 B2
(45) Date of Patent: Apr. 16, 2019

(54) SYSTEM FOR IMPLEMENTATION OF A HASH TABLE

(71) Applicants: CESNET, zajmove sdruzeni pravnickych osob, Prague (CZ); Ceske vysoke uceni technicke v Praze, Fakulta informacnich technologii, Prague (CZ)

(72) Inventors: Matej Bartik, Prague (CZ); Sven Ubik, Prague (CZ)

(73) Assignees: CESNET, ZAJMOVE SDRUZENI PRAVNICKYCH OSOB, Prague (CZ); CESKE VYSOKE UCENI TECHNICKE V PRAZE, FAKULTA INFORMACNICH TECHNOLOGII, Prague (CZ)

( * ) Notice: Subject to any disclaimer, the term of this patent is extended or adjusted under 35 U.S.C. 154(b) by 2 days.

(21) Appl. No.: 15/591,496

(22) Filed: May 10, 2017

(65) Prior Publication Data

US 2017/0330605 A1 Nov. 16, 2017

(30) Foreign Application Priority Data

May 10, 2016 (CS) ...................................... 2016-272

(51) Int. Cl.
*G11C 7/10* (2006.01)
*G06F 12/1018* (2016.01)
(Continued)

(52) U.S. Cl.
CPC ........ *G11C 7/1012* (2013.01); *G06F 12/0623* (2013.01); *G06F 12/1018* (2013.01);
(Continued)

(58) Field of Classification Search
CPC ............. G06F 12/0623; G06F 12/1018; G11C 7/1009; G11C 7/1012; G11C 8/12
(Continued)

(56) References Cited

U.S. PATENT DOCUMENTS 9,432,298 B1* 8/2016 Smith ................. H04L 49/9057
2013/0346719 A1* 12/2013 Tomlinson .............. G06F 12/10
711/165
2015/0019563 A1 1/2015 Wildman et al.

FOREIGN PATENT DOCUMENTS

WO  WO 2009/005758 A2  1/2009

OTHER PUBLICATIONS

Czech Republic Search report dated Jan. 27, 2017, issued in corresponding Swedish Patent Application No. PV 2016-272. (3 pages).
(Continued)

*Primary Examiner* — Tuan V Thai
*Assistant Examiner* — Edward Waddy, Jr.
(74) *Attorney, Agent, or Firm* — Buchanan Ingersoll & Rooney PC

(57) ABSTRACT

The system contains at least one basic block formed by a first multiplexer having an output is connected to a flag register memory, implemented as a LUT table. An output of a circuit for write permit to the memory is connected to the input of the write signal to the memory, which is further equipped with the clock signal input and the data input. The data output from the memory of each basic block is connected to a masking block relevant for the given basic block. The outputs of these masking blocks are connected to the inputs of the second multiplexer, while its output is the output of the system of flags. The input of the control signal for writing to the memory of each basic block is connected (Continued)

to the output of the demultiplexer and to the second input of the masking block for the given basic block.

4 Claims, 2 Drawing Sheets

(51) Int. Cl.
    *G06F 12/06*     (2006.01)
    *G11C 8/12*     (2006.01)
    *H03M 7/30*     (2006.01)
    *H03M 7/40*     (2006.01)

(52) U.S. Cl.
    CPC .............. *G11C 7/1009* (2013.01); *G11C 8/12* (2013.01); *H03M 7/3086* (2013.01); *H03M 7/40* (2013.01); *G06F 2212/401* (2013.01)

(58) Field of Classification Search
    USPC .................................................. 711/211; 1/1
    See application file for complete search history.

(56) References Cited

OTHER PUBLICATIONS

Zsolt, I. et al., "A flexible hash table design for 10GBPS key-value stores on FPGAS," 23rd International Conference on Field programmable Logic and Applications, pp. 1-8, Feb. 9, 2013.
Ehliar, A., "Extending the BlockRAMs in FPGAs to Support Caches and Hash Tables in an Efficient Manner, Field-Programmable Custom Computing Machines (FCCM)," 2012 IEEE 20th Annual International Symposium on, p. 242, Apr. 29, 2012.

* cited by examiner

SYSTEM FOR IMPLEMENTATION OF A HASH TABLE

BACKGROUND OF THE INVENTION

The presented invention deals with a system for the implementation of a hash table and thereby also a method of implementation of hash tables in hardware exploiting specific characteristics of field programmable gate arrays, FPGA. The solution belongs to the field of theoretical computer science and digital design.

DESCRIPTION OF PRIOR ART

Current systems using hash tables, for example for compression algorithms operations, can be divided into several categories. One of them represents systems where the hash tables do not need to be initialized. Another group includes systems where the hash tables are initialized during the first start of the algorithm, for example initialization by the FPGA bitstream or initialization by the dedicated algorithm, and where the speed of initialization is not critical for the given application because the system turns into the operating mode only after the initialization. Also, there are systems where the hash tables must be initialized in full operation at every startup of the algorithm to the required values, for instance when the LZ77 family data compression algorithms are implemented.

Hash tables of compression algorithms implemented in hardware are mostly implemented using high-density SRAM-type memory, such as Block RAM in the Xilinx circuitry, which is integrated on the FPGA chip. In order to save the integrated circuit area, these memories have no initialization signal input, which would allow for erasing data in the single clock cycle of the integrated circuit. All other parts of the FPGA-type integrated circuit have this option, a so-called reset.

High-density SRAM-type memory must therefore be initialized by sequential initialization of individual memory cells where the duration of initialization is equal to the product of the number of memory cells and the duration of the clock cycle of the given integrated circuit. This method can be considered trivial and efficient with respect to the system resources consumption, which is in orders equal to the binary logarithm of the hash table required size, but with a very long initialization time, and therefore it is not suitable for systems where the hash tables must be initialized repeatedly.

As an alternative, parts of the FPGA circuit can be used, which have the option to erase data in a single clock cycle, such as flip-flop circuits, which may be implemented by the low-density SRAM cells. Flip-flop circuits allow creating a system of flags where one flip-flop circuit contains the information about validity or invalidity of data in one hash table cell. This solution allows for fast initialization but the demands for system resources in the FPGA circuit are in orders linear to the required hash table size and for large hash tables they are enormous.

The above-mentioned implies that current solutions make it difficult to implement a hash table with fast initialization and simultaneously with low demands for system resources.

SUMMARY OF THE INVENTION

The setbacks mentioned above are removed by the system for implementation of a hash table according to the presented solution. The principle of this system is that it consists of at least one basic block where each basic block is formed by the first multiplexer equipped with the first and second address inputs and connected by its output to the address input of the flag register memory implemented as a LUT table, and connected to the circuit for write permit to the flag register memory. The circuit for write permit to the flag register memory is equipped with the input of the control signal for writing to the flag register memory. The output of this circuit for write permit to the flag register memory is interconnected with the input of the signal for writing to the flag register memory. This flag register memory is further equipped with the input of clock signal and data input. To the data input is, via the inverter, connected the input of the control signal for initialization of the flag register memory, which is also interconnected with a control input of the first multiplexer, and with the control input of the circuit for write permit to the flag register memory. The control input of the multiplexer switches an address input of the multiplexer to be passed to the output of the multiplexer. The data output from the flag register memory of each basic block is connected to one input of the masking block relevant for the given basic block. The outputs of such masking blocks are connected to the inputs of the second multiplexer, the output of which is the output of the systems of flags. The system further contains a demultiplexer, the output of which is connected to the input of the control signal for writing to the flag register memory of each basic block and also to the second input of the masking block relevant for the given basic block. The demultiplexer is equipped with the input of the signal for write permit and with the address input, which is connected to the output of the address splitter. The address splitter is equipped with the input of the address for the whole system of flags for normal operating mode with the width of K bits, where K is a positive integer number, and with the output of the address signal for addressing the flag register memory during normal operating mode, which is interconnected with the first address inputs of the first multiplexers of all basic blocks. The second address inputs of the first multiplexers of all basic blocks are interconnected with the output of the address signal for addressing the flag register memory for the counter initialization mode, while one input of the counter is interconnected with the inputs of the control signal for initialization of the basic blocks flag register memory and the second input is the input of the clock signal.

The presented solution allows to achieve the best-known ratio between the time needed for initialization of hash tables and the amount of system resources consumed by the FPGA circuit. The presented solution achieves higher operating frequency than both currently applied methods of creating the systems of flags for hash tables.

The system achieves a significant reduction of initialization time to an in orders constant value, as opposed to the approach based on sequential erasing each memory cell of the hash table, which features in orders linear time complexity. Also, the demand for system resources is significantly reduced as opposed to the approach using flip-flop circuits, minimum by $2^n$ times lesser value. In the case of LUT tables with typically 6 inputs, the demand for system resources is 64 times lower. The system combines positive features of both the preceding approaches and reduces the impact of their negative features.

The implementation of a hash table using the presented system has the following features. It achieves in orders constant time, typically 64 clock cycles, for erasing all flags of the whole memory, which is significantly shorter than with the trivial solution using sequential erasing the individual memory cells of the hash table. It has significantly lower demands for the system resources of the FPGA circuit as opposed to the solution implementing flip-flop circuits. For mid-sized hash tables in orders of several thousands of records, the demands for system resources are only 2 to 6 times higher than with the trivial solution, which requires creating a counter. The system features higher maximum achievable operating frequency, as opposed to the solution implementing the flip-flop circuits due to a significantly smaller occupied part of the FPGA circuit. With the exception of an extremely large-sized hash table, it also achieves higher maximum operating frequency than the trivial approach solution, which involves more logic stages inside the counter.

EXPLANATION OF DRAWINGS

A system for implementation of a hash table according to the presented invention will be further explained by means of the attached drawings.

DETAILED DESCRIPTION OF THE PREFERRED EMBODIMENTS

Figure 1:
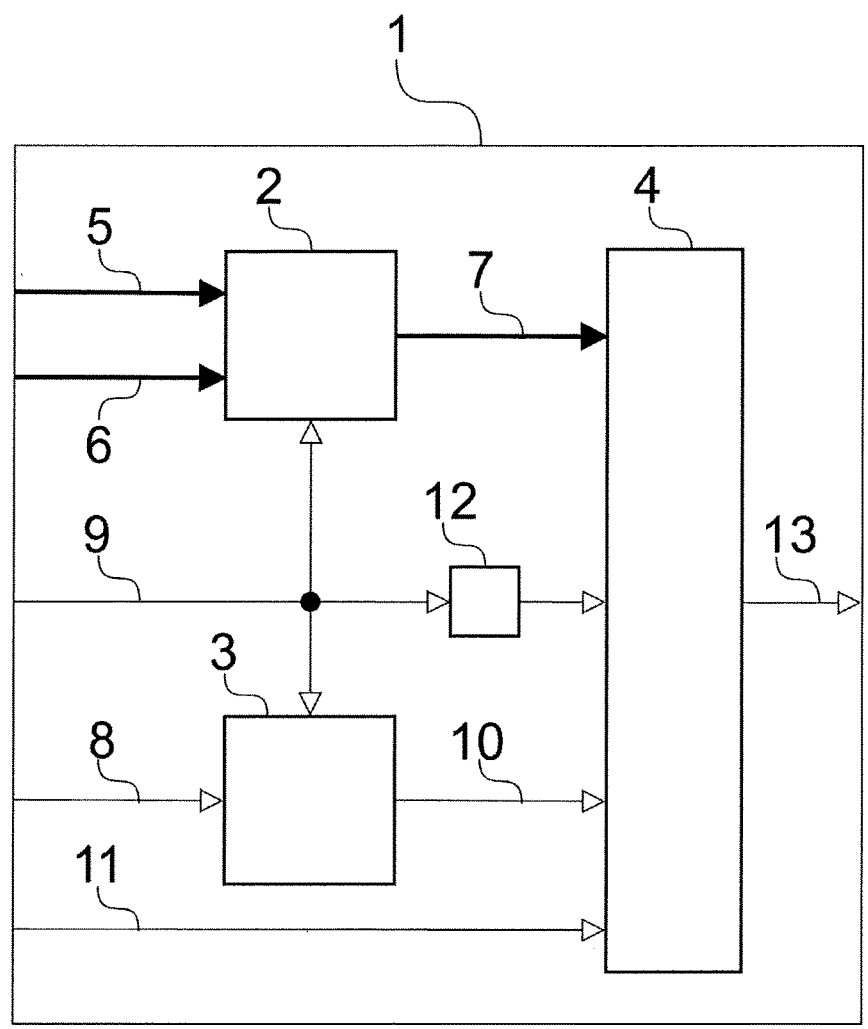
FIG. 1 shows the diagram of the basic block.
Figure 2:
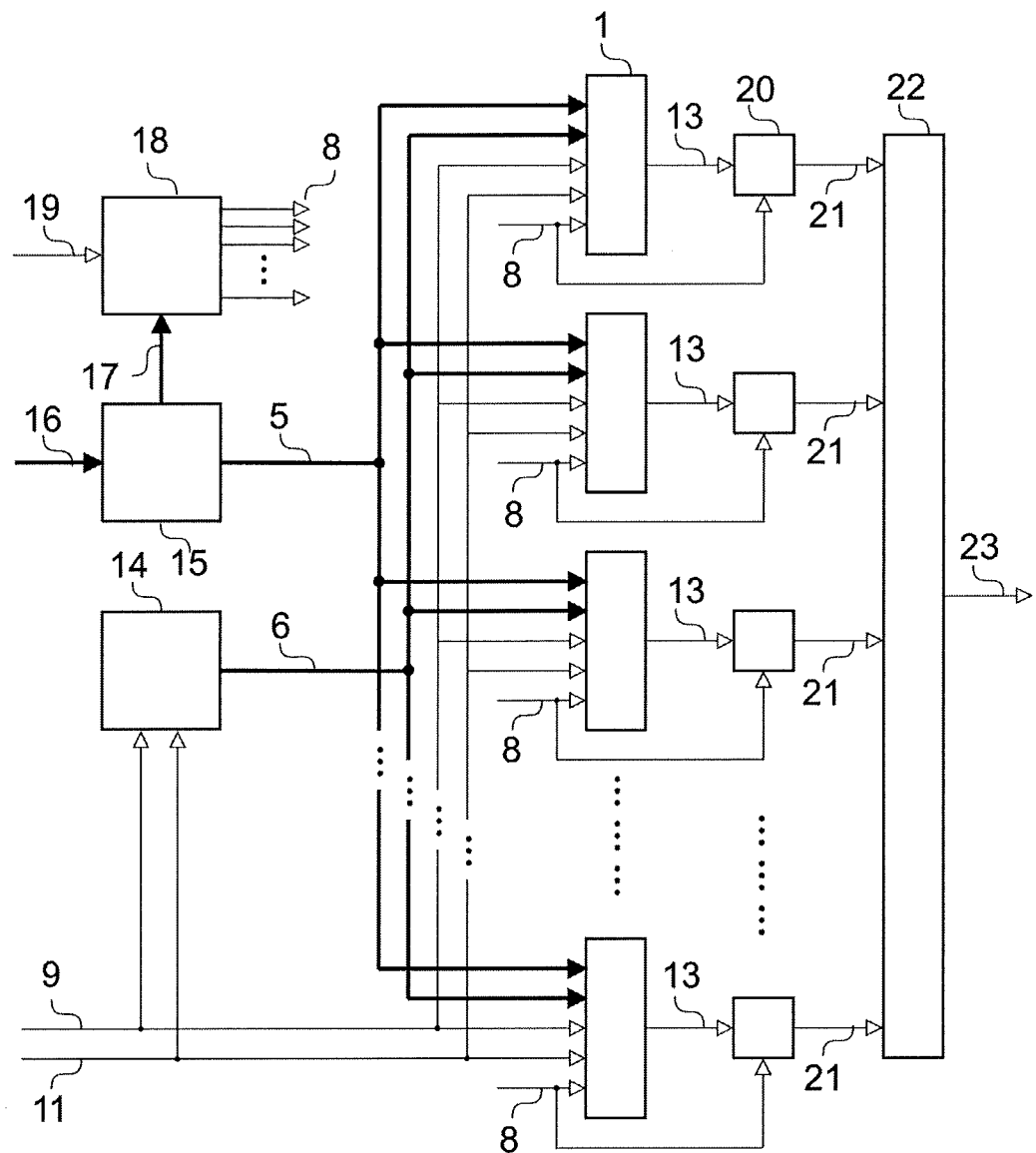
FIG. 2 shows an example of the connection of the complete system.

The description of the technical solution of a hash table with fast initialization and low demands for system resources is, for better clarity, divided into the description of the basic block 1 in FIG. 1, and the system consisting of the basic block 1 and its supporting functions in FIG. 2.

The system contains at least one basic block 1. Basic block 1 consists of the first multiplexer 2, a circuit for write permit 3 to the flag register memory 4 and the flag register memory 4, itself implemented as a LUT table.

The first multiplexer 2 is equipped with the first and second address inputs 5, 6 and its output is connected to the address input 7 of the flag register memory 4. The circuit for write permit 3 to the flag register memory 4 is equipped with the input 8 of the control signal of writing to the flag register memory 4. The output of the circuit for write permit 3 to the flag register memory 4 is connected to the input 10 of the write signal to the flag register memory 4. The flag register memory 4 is further equipped with the clock signal input 11 and data input 9, to which is, via the inverter 12, connected to the input 9 of the control signal for initialization of the flag register memory 4, which is also interconnected with the control input of the first multiplexer 2 and with the control input of the circuit for write permit 3 to the flag register memory 4. The data output 13 from the flag register memory 4 of each basic block 1 is connected to one input of the masking block 20 relevant for the given basic block 1, see FIG. 2. The outputs 21 of these masking blocks 20 are connected to the inputs of the second multiplexer 22. The output 23 of the second multiplexer 22 is the output of the system of flags. The input 8 of the control signal for writing to the flag register memory 4 of each basic block 1 is connected to the output of the demultiplexer 18 and simultaneously to the second input of the masking block 20, relevant for the given basic block 1. Demultiplexer 18 is equipped with the input 19 of the write permit signal and the address input 17, which is interconnected with the output of the address splitter 15. The address splitter 15 is equipped with the input 16 of the address for the whole system of flags for normal operating mode with the width of K bits, where K is a positive integer number, and with the output 5 of the address signal for addressing the flag register memory 4 during normal operating mode, which is interconnected with the first address inputs of the first multiplexers 2 of all basic blocks 1. The second address inputs of the first multiplexers 2 of all basic blocks 1 are interconnected with the output 6 of the address signal for addressing the flag register memory 4 for the counter 14 initialization mode. One input of the counter 14 is interconnected with the inputs 9 of the control signal for initialization of the flag register memory 4 of the basic blocks 1 and the second input is the input of the clock signal.

Within the basic block 1, from the output 5 of the address signal for addressing the flag register memory 4 during normal operating mode, and the output 6 of the address signal for addressing the flag register memory 4 for the initialization mode, are brought to the first multiplexer 2. The first multiplexer 2 is controlled by the signal at the input 9 of the control signal for initialization of the flag register memory 4 and its output is connected to the address input 7 of the flag register memory 4. The first multiplexer 2 serves for switching the required address of the flag register memory 4 between the initialization mode and the normal operating mode.

The circuit for write permit 3 to the flag register memory 4 creates the write signal at the input 10 of the write signal to the flag register memory 4 by logic operator OR based on the incoming control signal at the input 8 of the control signal for writing to the flag register memory 4 during normal operating mode, and the control signal at the input 9 of the control signal for initialization of the flag register memory 4.

The control signal from the input 9 of the control signal for initialization of the flag register memory 4 is, via the inverter 12, connected to the data input of the flag register memory 4, while its data output 13 indicates the completed write cycle into the selected flag.

To the input 11 of the clock signal of the flag register memory 4 is connected the clock signal.

The whole system for implementation of a hash table consists of at least one basic block 1, the corresponding number of masking blocks 20, the counter 14, address splitter 15, demultiplexer 18 and the second multiplexer 22.

The address from the input 16 of the address for the whole system of flags for normal operating mode with the width of K bits enters the address splitter 15, which splits the address into L of less significant bits, where L corresponds to the number of bits at the address inputs 7 of the flag register memories 4 in basic blocks 1, and this part is connected by the outputs 5 of the address signal for addressing the flag register memories 4 during normal operating mode of all basic blocks 1, and further to K-L of more significant bits, and this part is connected to the address input 17 of the demultiplexer 18.

When the signal is present at the input 16 of the write permit signal, the demultiplexer 18 transforms the value at address input 17 into activation of one of the outputs connected to the inputs 8 of the control signals for writing into the flag register memories 4 of individual basic blocks 1. The number of control signals at the inputs 8 of the control signals is given by the formula $2^{(K-L)}$.

Data outputs 13 from the flag register memories 4 of the basic blocks 1 are connected to the corresponding masking blocks 20, the outputs 21 of which are connected to the inputs of the second multiplexer 22. Always only one of all the masking blocks 20 operating as an AND-type logical element is activated by the logical value 1 at the input 8 of the control signal to the flag register memory 4 from the demultiplexer 18, which causes the signal to pass from its input to the output 21. Based on the Boolean algebra rules, specifically the logical 0 neutrality in the logical sum, the second demultiplexer 22 operating as an OR-type logical element provides propagation of the value of the input from the activated masking block 20 to the output of the system of flags 23.

During the time of activation by the signal of initialization at the input 9 of the control signal for the flag register memory 4 initialization, the counter 14 sets the control signal at the output 6 of the address signal for addressing the flag register memories 4 in all basic blocks 1 for the initialization mode sequentially to all values in residual (modulo) additive group with the basis $2^L$. This ensures that the whole address range of the flag register memories 4 in the basic blocks 1 is generated. The shift between individual steps of the counter 14 is activated by the clock signal from the input 11 of the clock signal, which simultaneously activates all the basic blocks 1.

The principle of the new solution, therefore, is deployment of a different part, so-called distributed memory, of the FPGA-type integrated circuit for implementation of the system of flags of data validity in a hash table memory cells instead of using the flip-flop circuits. Distributed memory in the FPGA circuit is implemented as a LUT table (Look-Up Table) with the size equal to $2^n$, where n is the number of data inputs and typically it equals 4 or 6. This approach, for example in the case of 6 inputs, allows the creating within a single LUT table a system of flags with the range of $2^6=64$ flags. Even though it is not possible to erase the content of the whole LUT table in a single clock cycle, it is possible to erase the contents of all these distributed memories simultaneously, since they are independent. In this case, the time needed to erase the system of flags is $2^n$ clock cycles, which is more than in the case of the alternative exploiting the flip-flop circuits where the erasure can be done within 1 clock cycle, but this time is in orders constant and independent of the size of the hash table.

INDUSTRIAL APPLICABILITY

The presented solution can find good industrial applicability, for example in systems implementing the LZ77 family data compression algorithms, which use hash tables that must be re-initialized at each activation of the algorithm to required values. The principle of the solution is, in particular, suitable for implementations in the FPGA-type integrated circuits with distributed memory implemented in form of the LUT tables (Look-Up Table).

The invention claimed is:
1. A system for the implementation of a hash table, comprising:
    at least one basic block, where each basic block includes:
        a flag register memory having a multiplexed input, a write signal input, a control signal input and a clock signal input,
        a first multiplexer having first and second address inputs, a control signal input and an output connected to the multiplexed input of the flag register memory that outputs either a first address during a normal mode or a second address during an initialization mode to the multiplexed input of the flag register memory in accordance with a control signal received at the control signal input,
        a write permit circuit that controls writing data to the flag register memory, having an input to receive a write control signal that permits writing to the flag register memory, and an control signal input and an output connected to an write signal input of the flag register memory in accordance with the write control signal and the control signal, and
        an inverter including a control signal input for receiving the control signal and an output that initializes of the flag register memory; and
    at least one masking block having a data input connected to a data output of the flag register memory of the at least one basic block, a write control signal input, and an output;
    a second multiplexer including an input connected to the output of the at least one masking block and an output that is the output of the a system;
    a demultiplexer including an input receiving the write control signal, an input receiving an address input and an output connected to the write control signal input of the write permit circuit of the at least one basic block and to the write control signal input of the at least one masking block;
    an address splitter including an address input receiving an address for the system during normal operating mode, wherein the address has a width of K bits, where K is a positive integer number, and an output connected to the first address input of the first multiplexer of the at least one basic block and outputting the address signal for addressing the flag register memory of the at least one basic block during normal operating mode; and
    a counter including a control signal input receiving the control signal and a clock signal input receiving the clock signal and an second address output connected to the first multiplexer of the at least one basic block for addressing the flag register memory.

2. The system of claim 1, further comprising a plurality of basic blocks and the at least one masking block includes a plurality of masking blocks, wherein the control signal input, the clock signal, and the first and second address inputs are input to each basic block, and each basic block in connected to a respective one of the plurality of masking blocks.

3. The system of claim 1, wherein the flag register memory implemented as a LUT table.

4. The system of claim 3, where in the flag register memory is a FPGA (Field Programmable Gate Array)-type integrated circuit.

* * * * *